(12) United States Patent
Roehr et al.

(10) Patent No.: US 6,903,959 B2
(45) Date of Patent: Jun. 7, 2005

(54) SENSING OF MEMORY INTEGRATED CIRCUITS

(75) Inventors: Thomas Roehr, Kanagawa (JP);
Hans-Oliver Joachim, Kanagawa (JP);
Joerg Wohlfahrt, Kanagawa (JP);
Norbert Rehm, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 289 days.

(21) Appl. No.: 10/065,168

(22) Filed: Sep. 24, 2002

(65) Prior Publication Data

US 2004/0057275 A1 Mar. 25, 2004

(51) Int. Cl.$^7$ ................................................ G11C 11/22
(52) U.S. Cl. .................... 365/145; 365/210; 365/149; 365/202; 365/205; 365/203; 365/196
(58) Field of Search .......................... 365/145, 203, 365/202, 205, 196, 149, 210

(56) References Cited

U.S. PATENT DOCUMENTS

| | | | | |
|---|---|---|---|---|
| 5,086,412 A | * | 2/1992 | Jaffe et al. | .............. 365/145 |
| 6,188,601 B1 | * | 2/2001 | Kim et al. | .............. 365/145 |
| 6,215,692 B1 | * | 4/2001 | Kang | .............. 365/145 |
| 6,236,588 B1 | * | 5/2001 | Koo | .............. 365/145 |
| 6,411,540 B1 | * | 6/2002 | Ashikaga | .............. 365/145 |
| 6,538,915 B2 | * | 3/2003 | Endo et al. | .............. 365/145 |
| 2003/0031059 A1 | * | 2/2003 | Endo et al. | .......... 365/189.09 |
| 2003/0095457 A1 | * | 5/2003 | Jeon et al. | .............. 365/205 |

FOREIGN PATENT DOCUMENTS

JP     02000348484 A  * 12/2000  ........... G11C/11/22

* cited by examiner

*Primary Examiner*—Viet Q. Nguyen
(74) *Attorney, Agent, or Firm*—Horizon IP Pte Ltd

(57) ABSTRACT

A memory IC having improved sensing during reads is disclosed. The IC includes the use of first and second reference voltages for sensing to compensate for asymmetry that exists between cells on bitline true and bitline complement. The first reference voltage is used for sensing a cell on bitline true while the second reference voltage is used for sensing a cell on bitline complement.

22 Claims, 6 Drawing Sheets

US 6,903,959 B2

SENSING OF MEMORY INTEGRATED CIRCUITS

BACKGROUND OF INVENTION

Ferroelectric metal oxide ceramic materials such as lead zirconate titanate (PZT) have been investigated for use in ferroelectric semiconductor memory devices. Other ferroelectric materials, for example, strontium bismuth tantalate (SBT) can also be used. The ferroelectric material is located between two electrodes to form a ferroelectric capacitor for storage of information. Ferroelectric capacitor uses the hysteresis polarization characteristic of the ferroelectric material for storing information. The logic value stored in the memory cell depends on the polarization of the ferroelectric capacitor. To change the polarization of the capacitor, a voltage which is greater than the switching voltage (coercive voltage) needs to be applied across its electrodes. The polarization of the capacitor depends on the polarity of the voltage applied. An advantage of the ferroelectric capacitor is that it retains its polarization state after power is removed, resulting in a non-volatile memory cell.

FIG. 1 shows a diagram of a portion of an IC. The portion includes first and second bitlines 107a–b with ferroelectric memory cells 105a–b. The bitlines, for example, form a bitline pair in a memory block or array. For purposes of simplifying the discussion, each bitline is depicted with one memory cell. However, it is understood that typically each bitlines includes a plurality of memory cells. A memory cell 105 includes a transistor 130 coupled to a capacitor 140. One terminal of the transistor is coupled to a bitline while the other terminal is coupled to a first electrode of the capacitor. The second capacitor electrode is coupled to a plateline 106. The first electrode is referred to as the top electrode (TE) and the second electrode is referred to as the bottom electrode (BE). A wordline 104 is coupled to the gate of the transistor The bitline pair is coupled to a sense amplifier (SA) 109.

The bitline coupled to the non-inverting terminal (+) of the SA is referred to as the bitline true (BL) and the bitline coupled to the inverting terminal (–) of the SA is referred to as the bitline complement (/BL).

To write to one of the memory cells of the bitline pair, the SA drives the bitlines to a voltage level which is on the data line DQ and the plate line is pulsed between a high and low voltage level. The appropriate wordline is selected, coupling the capacitor to its respective bitline. The voltage on the bitline and pulse create an electric field across the capacitor, causing the capacitor to have a polarization based on the electric field.

When using differential amplifiers, the assignment of physical direction of the polarization of the storage capacitor to the logical information stored in the memory cell depends on whether the selected cell is coupled to BL or /BL. For example, if a logic 0 is written to a memory cell on the bitline pair, the resulting voltage on BL would be a low voltage and a high voltage on /BL. As a result, the polarization direction of capacitor 140a on BL would be TE-BE while the polarization direction of capacitor 140b on /BL would be BE-TE.

To read from a memory cell, the SA precharges the bitlines to, for example, 0 volts. After the bitlines are precharged, the appropriate wordline is selected and a logic 1 pulse is provided on the plateline. The pulse, for example, is about 2.5 V. The pulse creates an electric field across the selected capacitor. This field produces a voltage or a read signal on the bitline to which the cell is coupled. The SA drives a reference voltage onto the bitline of the non-selected cell. The sense amplifier senses the differential of the read signal with the reference voltage and amplifies it. For example, a differential signal greater than or less than the reference voltage represents a logic 1 or 0. The larger the differential, the greater the signal-to-noise ratio or the larger the sensing window.

FIG. 2 shows the read signal distribution for the cells on BL and /BL. For example, the bolded lines 280 and 281 represent the read signal of logic 0 and logic 1for cells located on BL and the lighter lines 290 and 291 represent the read signal of logic 0 and logic 1 for cells located on /BL. As shown, the asymmetry that exists between the cells on BL and /BL has created a two fold distribution in the read signals. This undesirably reduces the differential between the read signal and reference voltage or sensing window 278, which can increase failures.

From the foregoing discussion, it is desirable to reduce the broadening of the read signal distribution to improve the sensing window.

SUMMARY OF INVENTION

The invention relates generally ICs in which the memory cells can be accessed with improved sensing window. In one embodiment, the IC includes at least first and second bitlines coupled to an inverting and non-inverting terminal of a sense amplifier. A reference control circuit is coupled to the sense amplifier. When reading a cell on the first bitline, the reference control circuit provides a first reference voltage to the sense amplifier for driving onto the second bitline. When reading a cell on the second bitline, the reference control circuit provides a second reference voltage to the SA for driving onto the first bitline. The use of first and second reference voltages advantageously increases the sensing window for read accesses.

DETAILED DESCRIPTION

Figure 3:
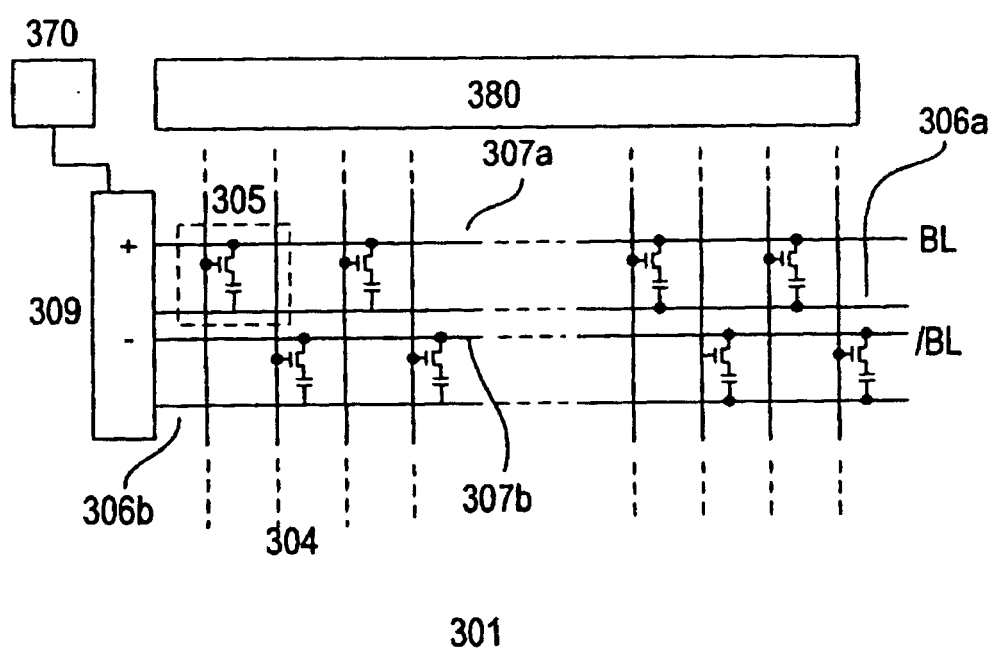
FIGS. 3–4 show a memory architectures in accordance with various embodiments of the invention.

The invention relates to improving sensing window in ferroelectric memory ICs. FIG. 3 shows a portion 301 of a ferroelectric memory IC in accordance with one embodiment of the invention. As shown, the portion includes first and second bitlines 307a–b, forming a bitline pair of an array which is configured in a folded bitline architecture. Memory cells 305 are located in alternate intersections between wordlines 304 and bitlines. A memory cell comprises a transistor coupled to a capacitor. One terminal of the transistor is coupled to a bitline and the gate of the transistor is coupled to a wordline. An electrode of the capacitor is coupled to a plateline 306.

A wordline driving circuit is coupled to the wordlines. An SA 309 is coupled to the bitline pair. BL is coupled to the non-inverting terminal while /BL is coupled to the inverting terminal. The SA includes, for example, sense amplifiers and precharging circuitry. The wordline driving circuit selects the appropriate wordline based on the row address. The SA is controlled by a column decoder and the wordline driving circuit is controlled by a row decoder. The platelines are controlled by a plate decoder. The plate decoder can be integrated Into the row or column decoder, depending on the architecture. A plurality of such bitline pairs are used to form a memory block or array.

Figure 4:
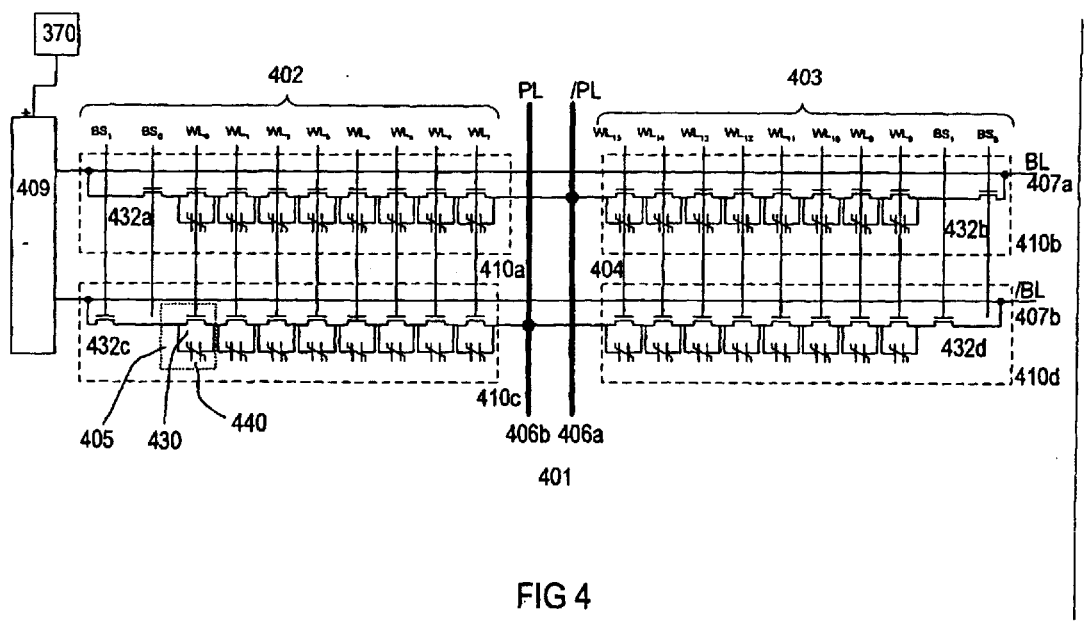

FIG. 4 shows a portion 401 of a memory IC in accordance with another embodiment of the invention. The portion includes first and second bitlines 407a–b that form a bitline pair. The bitlines are coupled to an SA 409. The first bitline (BL) is coupled to the non-inverting terminal of the SA and the second bitline (/BL) is coupled to the inverting terminal of the SA. As shown, each of the bitlines includes first and second groups of memory cells (410a–b or 410c–d). Such a memory architecture is described in, for example, Takashima et al., "High Density Chain Ferroelectric Random Access Memory (chain FRAM)", IEEEJrnl. of Solid State Circuits, vol.33, pp.787–792, May 1998, which is herein incorporated by reference for all purposes.

A group includes plurality of memory cells 405, each with a transistor 430 to a ferroelectric capacitor 440 in parallel. The memory cells of the group are coupled in series. In one embodiment, the group comprises 8 cells. Other group sizes are also useful. Preferably, number of cells in the group is equal to $2_x$, where x is a whole number. The gates of the cell transistors either serve as or are coupled to wordlines (WL) 404. A selection transistor 432 is provided to selectively couple one end of a memory group to a bitline while the other end is commonly coupled to the other memory group of the bitline and a plateline 406. The groups on BL are coupled to plateline 406a (PL) and the groups on /BL are coupled to plateline 406a (/PL).

In one embodiment, common signals control the selection transistors for memory groups of the same bitline. For example, BS0 controls selection transistors 432a–b to selectively couple memory groups 410a–b to BL; BS1 controls selection transistors 432c–d to memory groups 410c–d to /BL.

Numerous bitline pairs are interconnected via wordlines to form a memory block. In one embodiment, the memory block is separated into first (left) and second (right) sections 402 and 403, each comprising a group of a bitline. During a memory access, only one section is accessed (either left or right). Depending on which bitline the memory group of the selected cell is located, BS0 or BS1.

Although folded bitline and series architectures have been described with respect to FIGS. 3 and 4, other types of memory architectures, such as open bitline, are also useful.

With reference to both FIGS. 3 and 4, a reference control circuit 370 is coupled to the SA. The reference control circuit provides first and second reference voltages to the SA for charging one of the bitlines during a read access. For example, the first reference voltage is used for reading cells located on BL while the second reference voltage is used for reading cells located on /BL. The first and second reference voltages are selected to optimize the read signals to compensate for cell asymmetry for cells located on BL and /BL.

Figure 1:
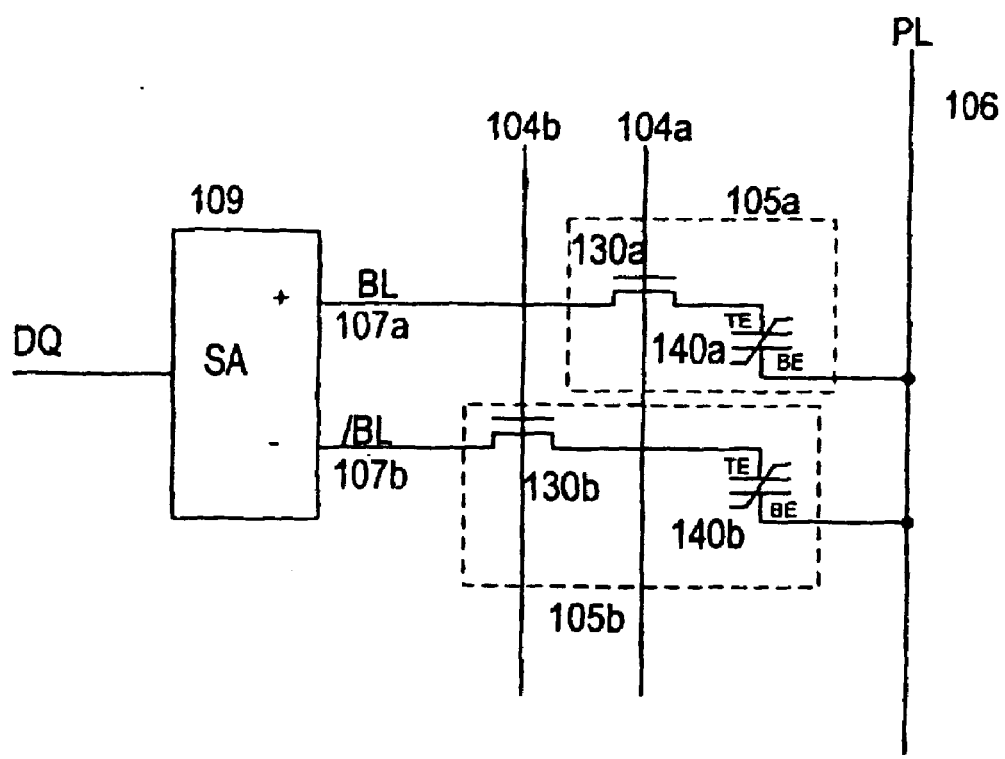
FIG. 1 shows a portion of an IC including a pair of bitlines with ferroelectric memory cells.
Figure 2:
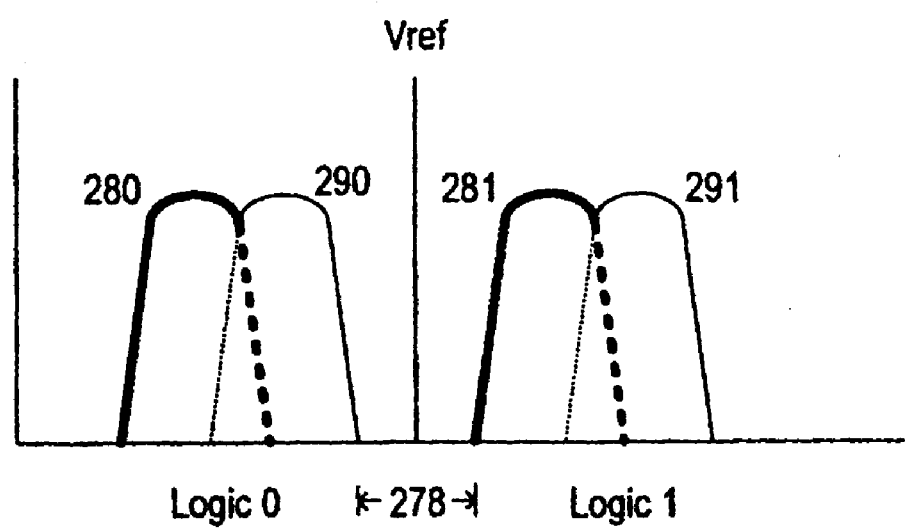
FIG. 2 shows conventional read signal distributions.
Figure 5:
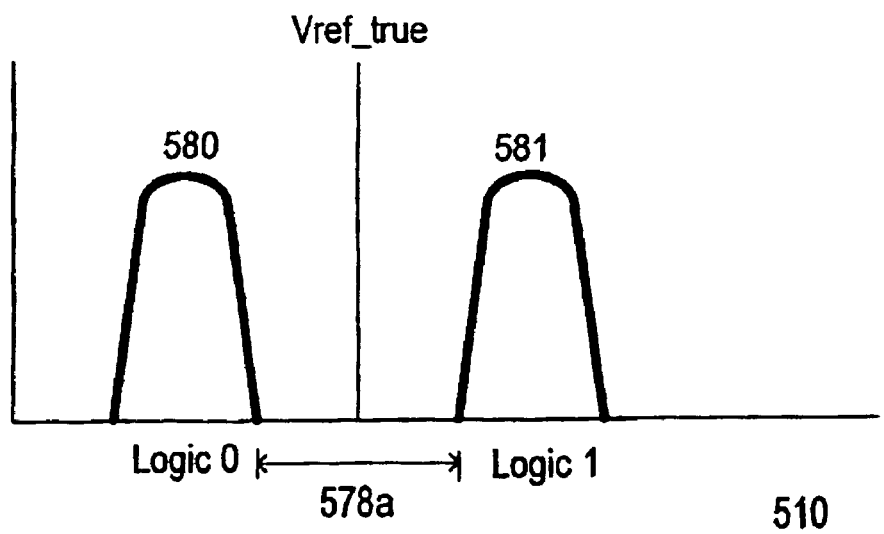
FIG. 5 shows read signal distributions for memory accesses in accordance with one embodiment of the invention.
Figure 5:
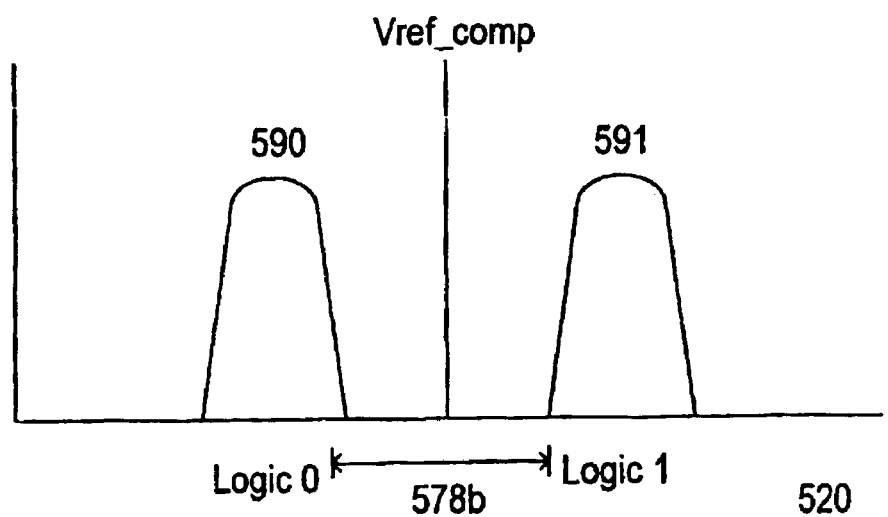

FIG. 5 shows read signal distributions 510 and 520 for true and complement cells respectively. In one embodiment, the reference signal for the true cells is selected to be about in the middle between the distribution for logic 0 and logic 1 read signals 580 and 581 for true cells. Likewise, the reference signal for the complement cells is selected to be about in the middle of the two distributions for logic 0 and logic 1 read signals 590 and 591 for complement cells. By providing separate reference signals for complement and true cells, a two-fold distribution of the read signals is avoided. This results in an increase in the sensing window 578 compared to conventional applications of one reference voltage (see FIG. 2).

Figure 6:
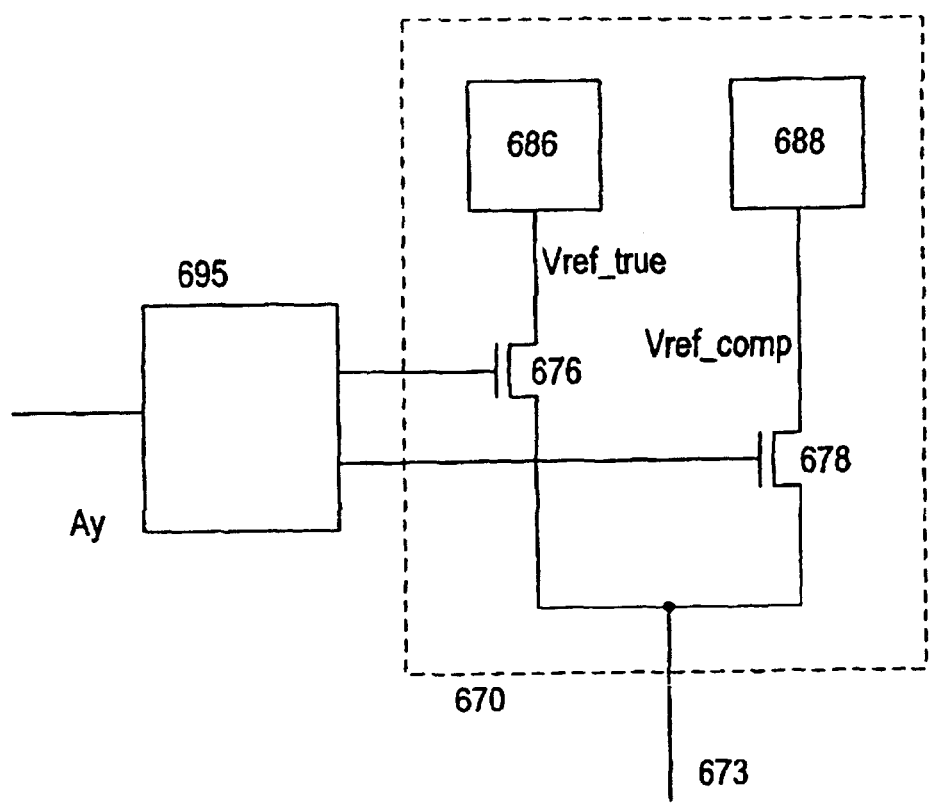
FIG. 6 shows one embodiment of the invention for improving sensing window.

FIG. 6 shows a reference control circuit 670 in accordance with one embodiment of the invention. The reference control circuit comprises first and second reference voltage generators 686 and 688. The first reference voltage generator provides a first reference voltage ($Vref_{13}$ true) for accessing a cell on BL and the second reference voltage generator provides a second reference voltage ($Vref_{13}$ comp) for accessing a cell on /BL. The output of the reference generators are coupled to an output 673 of the reference control circuit selection circuit via respective switches 676 and 678. In one embodiment, the switches are formed from transistors, such as n-FETs. Employing pFETs or a combination of both can also be useful.

In one embodiment, a selection circuit 695 is coupled to the reference control circuit. The selection circuit causes the reference control circuit to provide at the output 673 either the first or second reference voltage, depending on whether the selected memory cell is located on BL or /BL. For example, the reference control circuit outputs the first reference voltage if the selected cell is located on BL and outputs the second reference voltage if the selected cell is located on /BL. The SA places the reference voltage on the non-selected bitline of the bitline pair.

In one embodiment, the selection circuit receives address information Ay and determines if the selected memory cell is located on BL or /BL. The address information can be, for example, the least significant bit or LSB (e.g., Ay=LSB), depending on the architectural design. For example, LSB=0 represents address for while LSB=1 represents address for /BL or vice-versa. Other techniques for identifying the location of the cell can also be useful. If the selected cell is on BL, the selective circuit activates switch 676 and deactivates switch 678 to pass $Vref_{13}$ true to the output of the reference control circuit. On the other hand, the selective circuit activates switch 678 and deactivates switch 676 to pass Vref_comp to the output of the reference control circuit if the selected cell is located on /BL.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
   a first bitline with a plurality of memory cells;
   a second bitline with a plurality of memory cells;
   a sense amplifier having an inverting terminal coupled to the first bitline and a non-inverting terminal coupled to second bitline; and
   a reference voltage selection circuit coupled to the sense amplifier, the reference selection circuit generating either a first reference voltage for reading one of the plurality of memory cells on the first bitline or a second reference voltage for reading one of the plurality of memory cells on the second bitline.

2. The integrated circuit of claim 1 wherein the memory cells are ferroelectric memory cells.

3. The integrated circuit of claim 1 wherein the reference voltage selection circuit comprises an output terminal coupled to the sense amplifier.

4. The integrated circuit of claim 1, 2 or 3 wherein the reference voltage selection circuit generates either the first or second reference voltage at the output terminal for reading one of the plurality of memory cells on the first or second bitline.

5. The integrated circuit of claim 4 wherein the reference voltage selection circuit comprises a first reference generator for generating the first reference voltage and a second reference voltage generator for generating the second reference voltage.

6. The integrated circuit of claim 5 further comprises:
- a first switch, the first switch selectively couples the first reference generator to the output of the reference voltage selection circuit; and
- a second switch, the second switch selectively couples the second reference generator to the output of the reference voltage selection circuit.

7. The integrated circuit of claim 6 wherein the first and second switches are transistors.

8. The integrated circuit of claim 6 wherein the reference voltage selection circuit further comprises a select control circuit, the select control circuit receives input information and controls the first and second switches.

9. The integrated circuit of claim 8 wherein the input information comprises addressing information.

10. The integrated circuit of claim 8 wherein the input information comprises the least significant bit of the address.

11. The integrated circuit of claim 4 wherein the reference voltage selection circuit further comprises a select control circuit, the select control circuit receives input information and causes the reference selection circuit to generate the first or second reference voltage.

12. The integrated circuit of claim 11 wherein the input information comprises addressing information.

13. The integrated circuit of claim 11 wherein the input information comprises the least significant bit of the address.

14. The integrated circuit of claim 1 wherein the reference voltage selection circuit comprises a first reference generator for generating the first reference voltage and a second reference voltage generator for generating the second reference voltage.

15. The integrated circuit of claim 14 further comprises:
- a first switch, the first switch selectively couples the first reference generator to the sense amplifier to provide the sense amplifier with the first reference voltage; and
- a second switch, the second switch selectively couples the second reference generator to the sense amplifier to provide the sense amplifier with second reference voltage.

16. The integrated circuit of claim 15 wherein the first and second switches are transistors.

17. The integrated circuit of claim 16 wherein the reference voltage selection circuit further comprises a select control circuit, the select control circuit receives input information and controls the first and second switches.

18. The integrated circuit of claim 17 wherein the input information comprises addressing information.

19. The integrated circuit of claim 17 wherein the input information comprises the least significant bit of the address.

20. The integrated circuit of claim 14 wherein the reference voltage selection circuit further comprises a select control circuit, the select control circuit receives input information and causes the reference selection circuit to provide the first or second reference voltage.

21. The integrated circuit of claim 20 wherein the input information comprises addressing information.

22. The integrated circuit of claim 20 wherein the input information comprises the least significant bit of the address.

* * * * *